United States Patent
Lin et al.

(10) Patent No.: US 10,826,438 B2
(45) Date of Patent: Nov. 3, 2020

(54) BIAS CIRCUIT

(71) Applicant: INDUSTRIAL TECHNOLOGY RESEARCH INSTITUTE, Hsinchu (TW)

(72) Inventors: Gao-Ching Lin, Taichung (TW); Wei-Tsung Li, New Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 49 days.

(21) Appl. No.: 16/232,513

(22) Filed: Dec. 26, 2018

(65) Prior Publication Data

US 2020/0153390 A1    May 14, 2020

(30) Foreign Application Priority Data

Nov. 14, 2018  (TW) .............................. 107140316 A (51) Int. Cl.
  *H03F 1/30* (2006.01)
  *H03F 1/02* (2006.01)
  (Continued)

(52) U.S. Cl.
  CPC ............... *H03F 1/302* (2013.01); *H03F 1/32* (2013.01); *H03F 2200/451* (2013.01)

(58) Field of Classification Search
  USPC ................................. 330/285, 296, 288, 289
  See application file for complete search history.

(56) References Cited

U.S. PATENT DOCUMENTS 6,515,546 B2  2/2003 Liwinski
6,922,107 B1  7/2005 Green
  (Continued)

FOREIGN PATENT DOCUMENTS

CN  100563096 C  11/2009
CN  101795112 A   8/2010
  (Continued)

OTHER PUBLICATIONS

Taiwan Patent Office, "Office Action", dated Jan. 19, 2019, Taiwan.
  (Continued)

*Primary Examiner* — Hieu P Nguyen
(74) *Attorney, Agent, or Firm* — Locke Lord LLP; Tim Tingkang Xia, Esq.

(57) ABSTRACT

A bias circuit includes a buffer, a temperature compensation circuit, and a feedback circuit. The buffer includes a first transistor. A first terminal of the first transistor and a second terminal of the first transistor are electrically connected with a first voltage source. A third terminal of the first transistor is electrically connected with an external amplifier. The temperature compensation circuit includes a second transistor and a temperature compensation component. A first terminal of the second transistor is electrically connected with the third terminal of the first transistor. Two terminals of the temperature compensation component are electrically connected with a second terminal of the second transistor and the first voltage source respectively. A third terminal of the second transistor is grounded. The feedback circuit is electrically connected with the first terminal of the first transistor and the second terminal of the second transistor.

10 Claims, 7 Drawing Sheets

(51) Int. Cl.
    *H03F 3/19*     (2006.01)
    *H03F 3/21*     (2006.01)
    *H03F 1/32*     (2006.01)

(56) References Cited

U.S. PATENT DOCUMENTS

| | | | |
|---|---|---|---|
| 7,310,015 B2 * | 12/2007 | Jeon | H03F 1/30 |
| | | | 327/538 |
| 8,779,843 B2 | 7/2014 | Shioda | |
| 10,566,943 B2 * | 2/2020 | Li | H03F 3/19 |
| 2006/0055447 A1 | 3/2006 | Jeon et al. | |
| 2014/0232459 A1 | 8/2014 | Hzuka et al. | |
| 2014/0327482 A1 | 11/2014 | Ding et al. | |
| 2015/0002224 A1 | 1/2015 | Song et al. | |

FOREIGN PATENT DOCUMENTS

| | | |
|---|---|---|
| CN | 104375552 A | 2/2015 |
| TW | I460988 B | 11/2014 |
| TW | I467916 B | 1/2015 |
| TW | 201722068 A | 6/2017 |

OTHER PUBLICATIONS

Ericsson Mobility Visualizer website :https://www.ericsson.com/en/mobility-report/mobility-visualizer?f=7&ft=2&r=1&t=1,20&s=4&u=3&y=2017,2023&c=3, 2018.
Patrick Oßmann et al., A Circuit Technique to Compensate PVT Variations in a 28 nm CMOS Cascode Power Amplifier, GeMiC, 2015, Germany.
N.L. Wang et al., High Efficiency 28V Class AB InGaP/GaAs HBT MMIC Amplifier with Integrated Bias Circuit, IEEE MTT-S Digest, 2003.
Wei-Chun Hua et al., High-Linearity and Temperature-Insensitive 2.4 GHz SiGe Power Amplifier with Dynamic-Bias Control, IEEE Radio Frequency Integrated Circuits Symposium, 2005.
N. Srirattana et al., SiGe HBT Power Amplifier for IS-95 CDMA Using a Novel Process, Voltage, and Temperature Insensitive Biasing Scheme, IEEE, 2003.
J. Jeon et al., Temperature compensating bias circuit for GaAs HBT RF power amplifiers with stage bypass architecture, Electronics Letters, 2008, vol. 44, No. 19.
Wei-Ling Chang et al., Temperature Insensitive PA Bias Circuit With Digital Control Interface Using InGaP/GaAs HBT Technology, Proceedings of the 45th European Microwave Conference, 2015.

* cited by examiner

BIAS CIRCUIT

CROSS-REFERENCE TO RELATED APPLICATIONS

This non-provisional application claims priority under 35 U.S.C. § 119(a) on Taiwan Application Serial Number 107140316, filed on Nov. 14, 2018, the entire contents of which are hereby incorporated by reference.

BACKGROUND

1. Technical Field

This disclosure relates to a bias circuit

2. Related Art

Many circuit systems have power amplifiers, such as communication systems. In a mobile phone communication system, the power amplifier amplifies the intensity of the RF signal to be transmitted to a power standard for transmitting to a remote wireless receiver through antennas and air. However, if the characteristics of the power amplifier (or the driving voltage or the driving current supplied to the power amplifier) is easily varied with a temperature, the power amplifier may be in an unstable state or its efficiency may be attenuated, which may affect the performance of the circuit.

SUMMARY

According to one or more embodiment of this disclosure, a bias circuit is provided, and the bias circuit comprises a buffer, a temperature compensation circuit and a feedback circuit. The buffer includes a first transistor, first and second terminals of the first transistor are electrically connected with a first voltage source, a third terminal of the first transistor is electrically connected with an external amplifier. The temperature compensation circuit includes a second transistor and a temperature compensation component, a first terminal of the second transistor is electrically connected with the third terminal of the first transistor, two terminals of the temperature compensation component are electrically connected with a second terminal of the second transistor and the first voltage source respectively, a third terminal of the second transistor is grounded. The feedback circuit is electrically connected with the first terminal of the first transistor and the second terminal of the second transistor.

BRIEF DESCRIPTION OF THE DRAWINGS

The disclosure will become more fully understood from the detailed description given herein below and the accompanying drawings which are given by way of illustration only and thus are not limitative of the disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
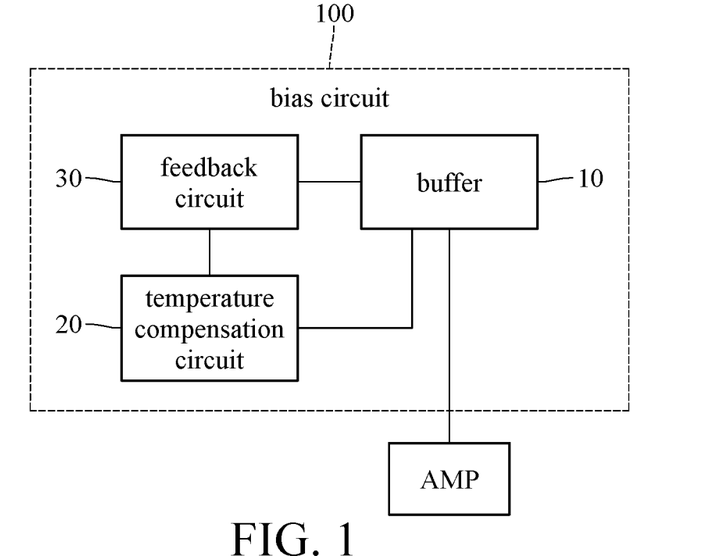
FIG. 1 is a functional block diagram of a bias circuit according to an embodiment of the disclosure.
Figure 2:
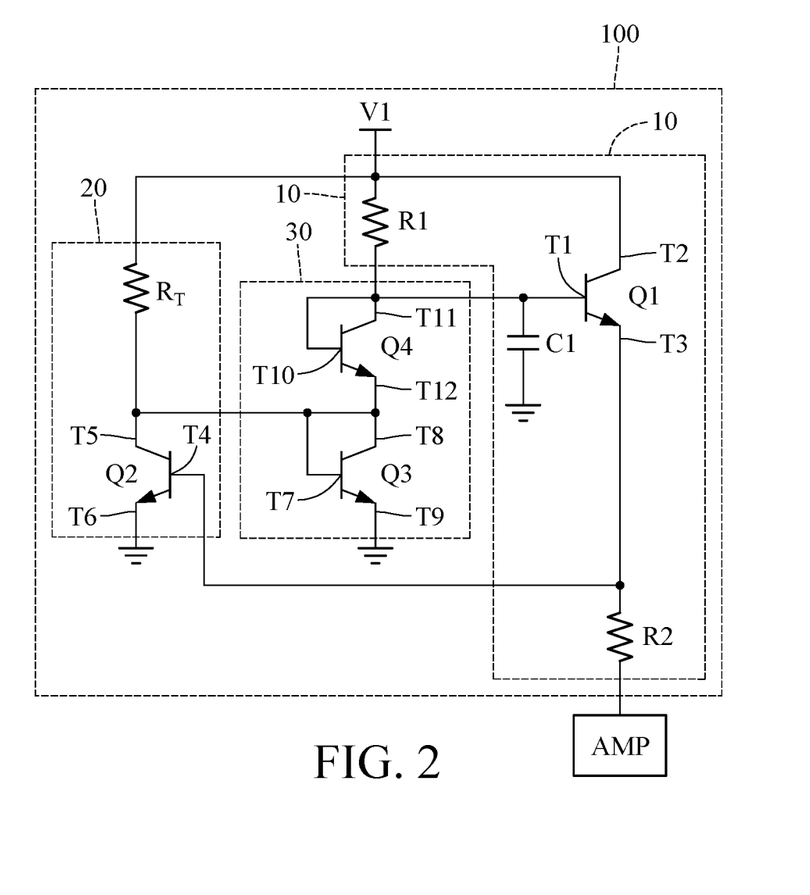
FIG. 2 is a circuit architecture diagram of a bias circuit according to a first embodiment of the disclosure.

Please refer to FIG. 1 which is a functional block diagram of a bias circuit according to an embodiment of the disclosure. FIG. 2 is a circuit architecture diagram of a bias circuit according to an embodiment of the disclosure. Referring to FIG. 1 and FIG. 2, the bias circuit 100 is adapted to an external amplifier (AMP). For example, the external amplifier AMP may be a power amplifier (PA), a variable gain amplifier (VGA), or a low noise amplifier (LNA). The bias circuit 100 may include a buffer 10, a temperature compensation circuit 20, and a feedback circuit 30. The buffer 10 is electrically connected with an input terminal of the external amplifier AMP and the feedback circuit 30, and the temperature compensation circuit 20 is electrically connected with an output terminal of the buffer 10 and the feedback circuit 30.

For example, the buffer 10 may be an emitter follower, and the emitter follower includes a first transistor Q1, a first resistor R1, a second resistor R2 and a first capacitor C1. The first transistor Q1 includes a first terminal T1, a second terminal T2 and a third terminal T3. The first terminal T1 is electrically connected with one terminal of the first capacitor C1. The other terminal of the first capacitor C1 is grounded. Two terminals of the first resistor R1 is respectively and electrically connected with the first capacitor C1 and a first voltage source V1, wherein the first capacitor C1 has a function of improving linearity. The second terminal T2 is electrically connected with the first voltage source V1, and the third terminal T3 is electrically connected with the second resistor R2 and is configured to electrically connect with an input terminal of the external amplifier AMP.

Due to the characteristics of the high current gain and low output impedance of the emitter follower, the output terminal of the emitter follower is electrically connected with the input terminal of the power amplifier to provide a sufficient driving current to the power amplifier. However, since the emitter follower has a negative resistance-temperature coefficient, the resistance of the transistor drops when the ambient temperature rises, which makes the collector current rise. Conversely, the resistance of the transistor rises when the ambient temperature drops, which makes the collector current drop. In this way, the driving current supplied by the emitter follower to the power amplifier may be in an unstable state due to a temperature influence, and the power amplifier also has a performance degradation due to temperature effects. Therefore, the temperature compensation circuit 20 may be used for temperature compensation.

The temperature compensation circuit 20 includes a second transistor Q2 and a temperature compensation component. For example, the temperature compensation component may be a passive component such as a resistor or an inductor. In this embodiment, the temperature compensation component is a temperature compensation resistor $R_T$. The second transistor Q2 includes a first terminal T4, a second terminal T5, and a third terminal T6. The first terminal T4 of the second transistor Q2 is electrically connected with the third terminal T3 of the first transistor Q1. The two terminals of the temperature compensation resistor $R_T$ are respectively and electrically connected with the second terminal T5 of the second transistor Q2 and the first voltage source V1. The third terminal T6 of the second transistor Q2 is grounded. Grounding or grounded may be directly or indirectly grounded. For example, the third terminal T6 of the second transistor Q2 is grounded may mean that the third terminal T6 of the second transistor Q2 is directly grounded, or the third terminal T6 of the second transistor Q2 is electrically connected with one terminal of another component, and another terminal of the component is directly grounded (or another terminal of the component is connected to still another components and then is directly grounded.)

The feedback circuit 30 includes a third transistor Q3 and a fourth transistor Q4. The third transistor Q3 includes a first terminal T7, a second terminal T8, and a third terminal T9. The first terminal T7 of the third transistor Q3 is electrically connected with the second terminal T8 of the third transistor Q3 and the second terminal T5 of the second transistor Q2. The third terminal T9 of the third transistor Q3 is grounded. The fourth transistor Q4 includes a first terminal T10, a second terminal T11, and a third terminal T12. The first terminal T10 of the fourth transistor Q4 is electrically connected with the second terminal T11 of the fourth transistor Q4 and the first terminal T1 of the transistor Q1. The third terminal T12 of the fourth transistor Q4 is electrically connected with the second terminal T8 of the third transistor Q3.

In this embodiment, the first transistor Q1, the second transistor Q2, the third transistor Q3 and the fourth transistor Q4 are NPN type bipolar junction transistors (BJTs). In other embodiments, the first transistor Q1, the second transistor Q2, the third transistor Q3 and/or the fourth transistor Q4 may be a PNP type BJT(s) or a N-type metal oxide semiconductor field effect transistor(s) (MOSFET), a P-type MOSFET(s) or other type transistor(s). In another embodiment, the third transistor Q3 and/or the fourth transistor Q4 may be a diode(s). In this embodiment, the voltage provided by the first voltage source V1 is sufficient to make the first transistor Q1, the second transistor Q2, the third transistor Q3, and the fourth transistor Q4 all in an on state. Since a current of the first terminal T1 of the first transistor Q1 is much smaller than a current of the second terminal T2 of the first transistor Q1, a current flowing into the second terminal T2 of the first transistor Q1 approximates a current flowing out of the third terminal T3.

In the operation of the circuits according to the above embodiment, when an ambient temperature rises, the current flowing into the second terminal T2 of the first transistor Q1 (a collector current in the above embodiment) and the current flowing out of the third terminal T3 of the first transistor Q1 (an emitter current in the above embodiment) rise, and the voltage of the first terminal T4 of the second transistor Q2 (a base voltage in the above embodiment) also rises accordingly. When the voltage of the first terminal T4 of the second transistor Q2 rises, a current flowing into the second terminal T5 of the second transistor Q2 rises accordingly. When the current flowing into the second transistor Q2 rises, the current flowing through the temperature compensation resistor $R_T$ also rises. Therefore, a dropout voltage across the temperature compensation resistor $R_T$ rises, so that a voltage of the second terminal T5 of the second transistor Q2 (a collector voltage in the above embodiment) drops. When the voltage of the second terminal T5 of the second transistor Q2 drops, the voltage of the third terminal T12 of the fourth transistor Q4 also drops since the second terminal T5 of the second transistor Q2 is electrically connected with the second terminal T8 of the third transistor Q3 (the second terminal T5 is connected with the second T8 in the above embodiment) and the second terminal T8 of the third transistor Q3 is electrically connected with the third terminal T12 of the fourth transistor Q4 (the second terminal T8 is connected with the third terminal T12 in the above embodiment). When the voltage of the third terminal T12 of the fourth transistor Q4 drops, the voltage of the first terminal T10 of the fourth transistor Q4 also drops since a voltage $V_{BE4}$ between the base and the emitter of the fourth transistor Q4 in an on state is a constant value. Since the first terminal T10 of the fourth transistor Q4 is electrically connected with the first terminal T1 of the first transistor Q1 (the first terminal T10 is connected with the first terminal T1 in the above embodiment), the voltage of the first terminal T1 of the first transistor Q1 drops when the voltage of the first terminal T10 of the fourth transistor Q4 drops. When the voltage of the first terminal T1 of the first transistor Q1 (a base voltage in the above embodiment) drops, the current flowing into the second terminal T2 of the first transistor Q1 (a collector current in the above embodiment) also drops. Therefore, the temperature compensation function can be achieved.

On the contrary, when the ambient temperature drops to drop the current flowing into the second terminal T2 of the first transistor Q1, the voltage of the first terminal T1 of the first transistor Q1 and the current flowing into the second terminal T2 of the first transistor Q1 (a collector current in the above embodiment) rise by the configuration of the temperature compensation circuit 20 and the feedback circuit 30.

As can be seen from the above disclosure, the temperature compensation circuit 20 and the feedback circuit 30 can compensate for the temperature effects of the buffer 10. On the other hand, the temperature compensation amount for the buffer 10 can be adjusted by adjusting the second transistor Q2 and a magnitude of the temperature compensation resistor $R_T$.

In one embodiment, the buffer includes a first transistor Q1. A first terminal T1 and a second terminal T2 of the first transistor Q1 are electrically connected with a first voltage source V1. A third terminal T3 of the first transistor Q1 is electrically connected with an external amplifier AMP. A temperature compensation circuit includes a second transistor Q2 and a temperature compensation component. A first terminal T4 of the second transistor Q2 is electrically connected with the third terminal T3 of the first transistor Q1. Two terminals of the temperature compensation component are electrically connected with a second terminal T5 of the second transistor Q2 and the first voltage source V1 respectively. A third terminal T6 of the second transistor Q2 is grounded. A feedback circuit is electrically connected with the first terminal T1 of the first transistor Q1 and the second terminal T2 of the second transistor Q2.

Figure 3:
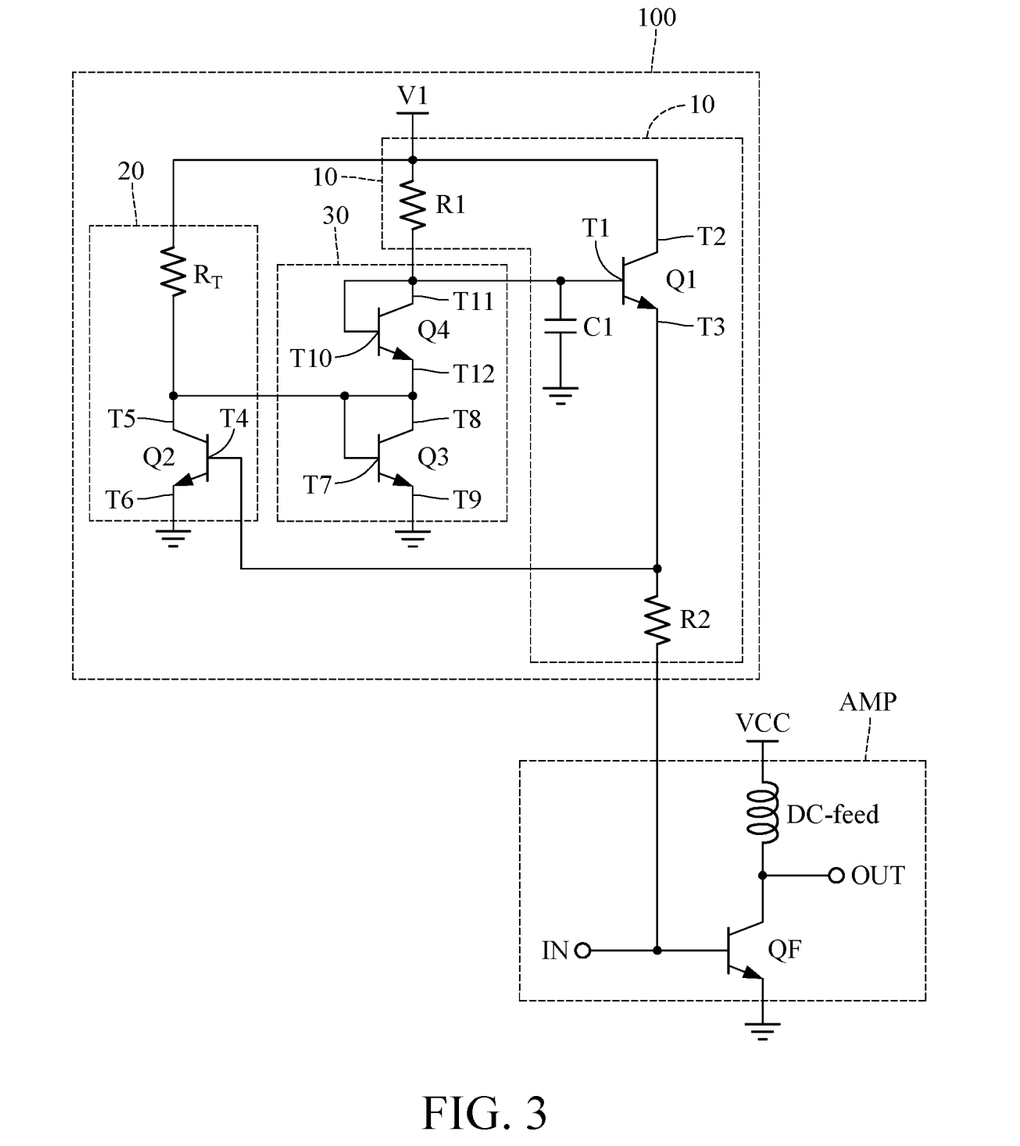
FIG. 3 is a schematic view of a bias circuit connected with an external amplifier according to an embodiment of the disclosure.

FIG. 3 is a schematic view of a bias circuit connected with an external amplifier according to an embodiment of the disclosure. The external amplifier AMP includes a transistor QF and a DC-feed element. For example, the DC-feed element may be a resistor or an inductor. In this embodiment, the DC-feed element is an inductor as shown in FIG. 3. As shown in FIG. 3, the external amplifier AMP includes the transistor QF and a DC-feed inductor (labeled DC-feed in FIG. 3). The third terminal T3 of the first transistor Q1 is electrically connected with an input terminal IN of the transistor QF through the second resistor R2. An output terminal OUT of the transistor QF is electrically connected with another voltage source VCC through the DC feed inductor.

Figure 4:
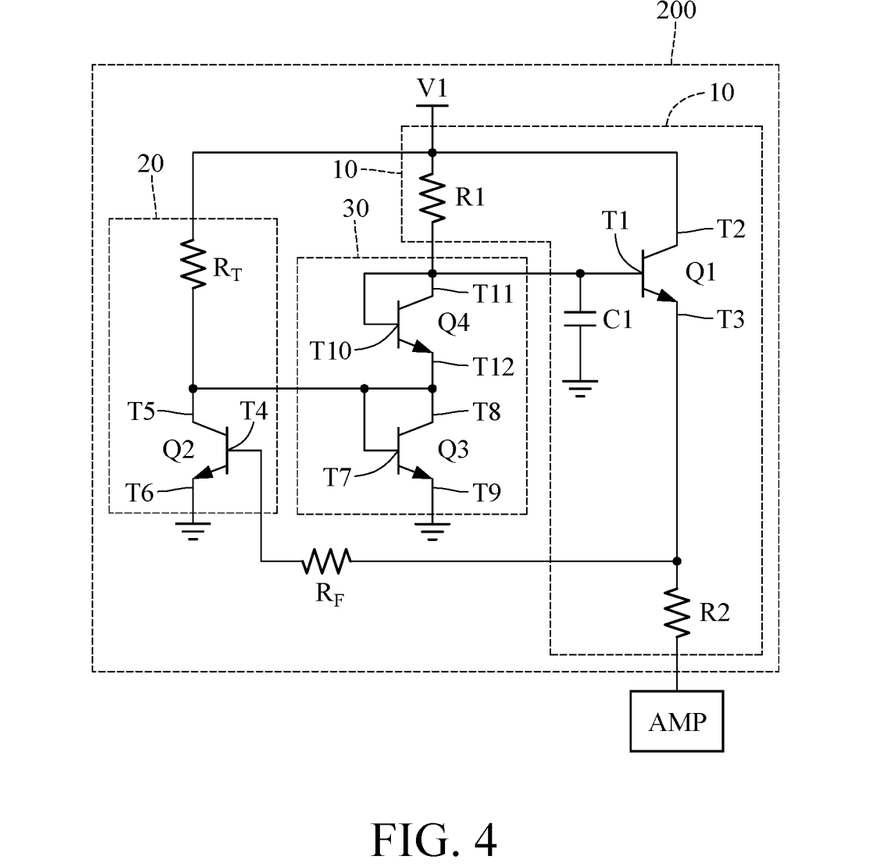
FIG. 4 is a circuit architecture diagram of a bias circuit according to a second embodiment of the disclosure.

FIG. 4 is a circuit architecture diagram of a bias circuit according to a second embodiment of the disclosure. As shown in FIG. 4, in addition to the buffer 10, the temperature compensation circuit 20 and the feedback circuit 30, the bias circuit 200 further includes a feedback resistor $R_F$. The two terminals of the feedback resistor $R_F$ are electrically connected with the first terminal T4 of the second transistor Q2 and the third terminal T3 of the first transistor Q1 respectively. A function of the second transistor Q2 is to detect the current of the first transistor Q1 that needs the temperature compensation. Therefore, the value of the feedback resistor $R_F$ may be adjusted to control the amount of the current flowing into the second transistor Q2, so as to affect the amount of the current of the first transistor Q1. Therefore, the efficiency of the external amplifier AMP may be improved.

Figure 5:
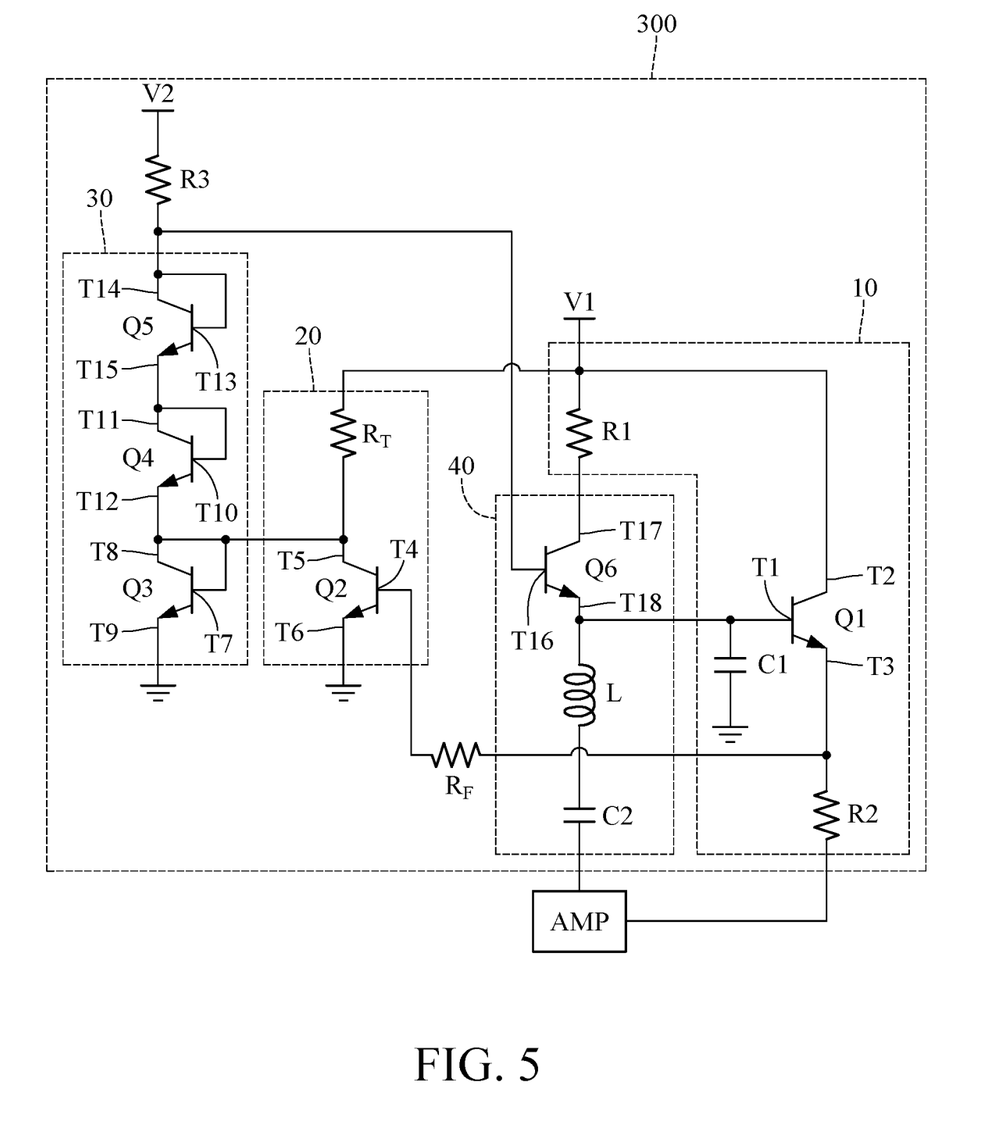
FIG. 5 is a circuit architecture diagram of a bias circuit according to a third embodiment of the disclosure.

FIG. 5 is a circuit architecture diagram of a bias circuit according to a third embodiment of the disclosure. The bias circuit 300 of FIG. 5 further includes a linearization circuit 40. The linearization circuit 40 is configured to electrically connect with the input terminal of the external amplifier AMP and is electrically connected with the feedback circuit 30 and the buffer 10. In this embodiment, in addition to the temperature compensation function, the bias circuit 300 further has a linearization compensation function to avoid a distortion of a signal transmitted to the external amplifier AMP.

In this embodiment, the feedback circuit 30 includes a third transistor Q3, a fourth transistor Q4 and a fifth transistor Q5. The third transistor Q3 is electrically connected with the fourth transistor Q4 in the same manner as the first embodiment. The fifth transistor Q5 includes a first terminal T13, a second terminal T14 and a third terminal T15. The first terminal T13 of the transistor Q5 is electrically connected with the second terminal T14 of the fifth transistor Q5, the input terminal of the linearization circuit 40, and is electrically connected with a second voltage source V2 via a third resistor R3. The third terminal T15 of the fifth transistor Q5 is electrically connected with the second terminal T11 of the fourth transistor Q4. The third resistor R3 is connected between the second voltage source V2 and the second terminal T14 of the fifth transistor Q5. The value of the third resistor R3 can be adjusted to change the temperature compensation amount.

The linearization circuit 40 includes a sixth transistor Q6, a linear compensation inductor L, and a linear compensation capacitor C2. The sixth transistor Q6 includes a first terminal T16, a second terminal T17 and a third terminal T18. The first terminal T16 of the sixth transistor Q6 is electrically connected with the second terminal T14 of the fifth transistor Q5. The two terminals of the first resistor R1 are electrically connected with the first voltage source V1 and the second terminal T17 of the sixth transistor Q6 respectively. The third terminal T18 of the sixth transistor Q6 is electrically connected with the linear compensation inductor L and the first terminal T1 of the first transistor Q1. The linear compensation inductor L is connected in series with the linear compensation capacitor C2. The linear compensation capacitor C2 is configured to electrically connect with the input terminal of the external amplifier AMP. The value of the second voltage source V2 is greater than the value of the first voltage source V1 so that the first to sixth transistors Q1-Q6 are all in on states.

In one embodiment, the first voltage source V1 and the second voltage source V2 may be two independent voltage sources. In another embodiment, the second voltage source V2 is an independent voltage source. The first voltage source V1 may be generated from the second voltage source V2 by connecting the second voltage source V2 with a voltage dividing circuit. For example, the second voltage source may be electrically connected with resistors and/or other active or passive component to generate the first voltage source V1. In other embodiments, another independent voltage source may be connected with a voltage dividing circuit to generate the first voltage source V1 and the second voltage source V2. The sixth transistor Q6 can isolate the feedback circuit 30 from the first transistor Q1 to prevent the current of the feedback circuit 30 from directly flowing into the first terminal T1 of the first transistor Q1 and affecting linear compensation functions of the linear compensation inductor L and the linear compensation capacitor C2.

Figure 6:
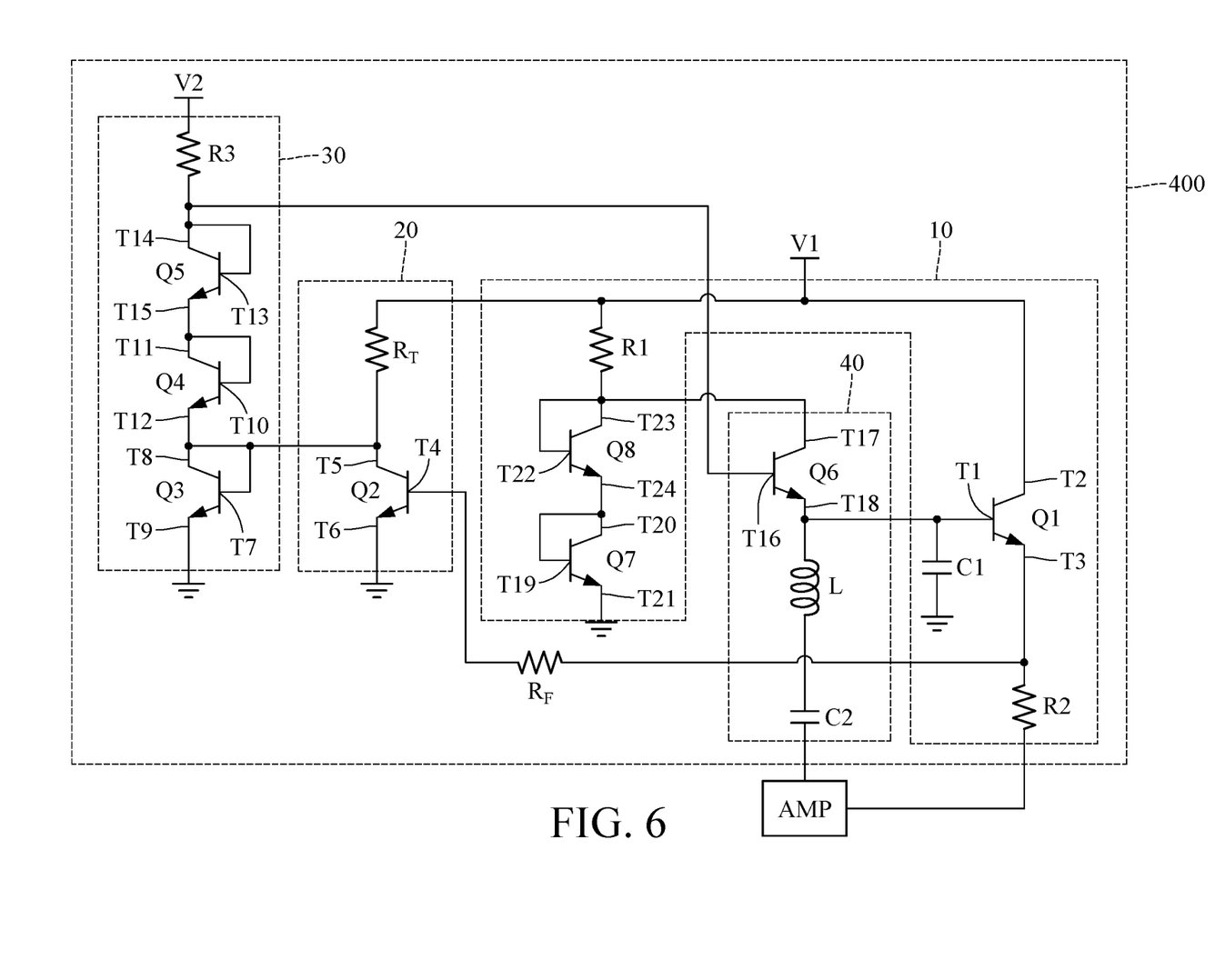
FIG. 6 is a circuit architecture diagram of a bias circuit according to a fourth embodiment of the disclosure.

FIG. 6 is a circuit architecture diagram of a bias circuit according to a fourth embodiment of the disclosure. As shown in FIG. 6, the buffer 10 of the bias circuit 400 further includes a seventh transistor Q7 and an eighth transistor Q8. The seventh transistor Q7 includes a first terminal T19, a second terminal T20 and a third terminal T21. The first terminal T19 of the seventh transistor Q7 is electrically connected with the second terminal T20 of the seventh transistor Q7. The third terminal T21 of the seventh transistor Q7 is grounded. The eighth transistor Q8 includes a first terminal T22, a second terminal T23 and a third terminal T24. The first terminal T22 of the eighth transistor Q8 is electrically connected with the second terminal T23 of the eighth transistor Q8 and is electrically connected with the first voltage source V1 via the first resistor R1. The third terminal T24 of the eighth transistor Q8 is electrically connected with the second terminal T20 of the seventh transistor Q7. The seventh transistor Q7 and the eighth transistor Q8 have voltage regulation and temperature compensation functions. The first transistor Q1, the second transistor Q2, the third transistor Q3, the fourth transistor Q4, the fifth transistor Q5, the sixth transistor Q6, the seventh transistor Q7, and/or the eighth transistor Q8 may be a NPN type BJT(s), a PNP type BJT(s), a N type MOSFET(s), a P type MOSFET(s) or other type transistor(s). In another embodiment, the third transistor Q3, the fourth transistor Q4, the fifth transistor Q5, the seventh transistor Q7, and/or the eighth transistor Q8 may be a diode(s).

Figure 7:
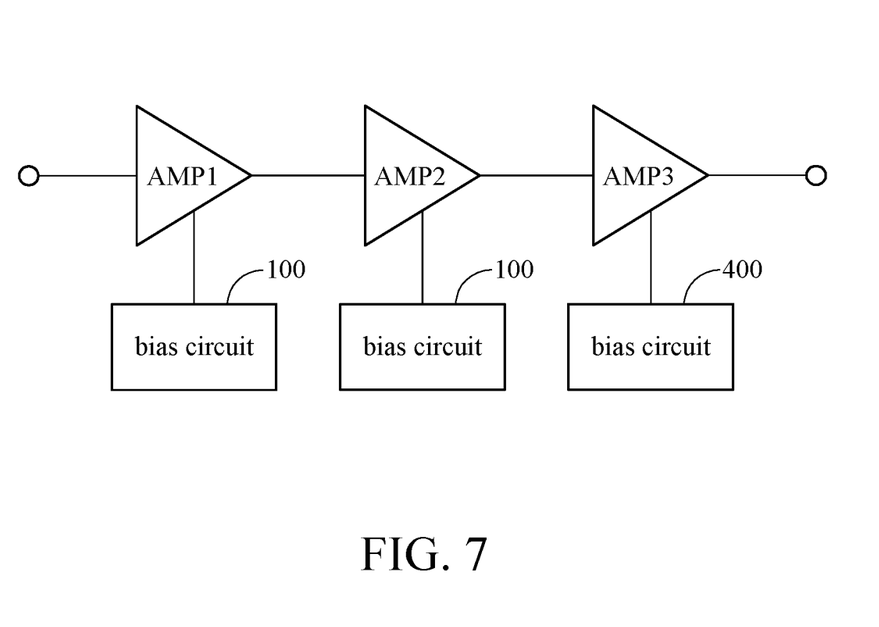
FIG. 7 is a schematic view of a multi-stages amplifier with several bias circuits according to an embodiment of the disclosure.

FIG. 7 is a schematic view of a multi-stages amplifier with several bias circuits according to an embodiment of the disclosure. As shown in FIG. 7, since each of a first stage amplifier AMP1 and a second stage amplifier AMP2 is not an output stage of a multi-stages amplifier, the first stage amplifier AMP1 and the second stage amplifier AMP2 may only need the temperature compensation function and are electrically connected with the bias circuit 100 of the first embodiment to achieve the requirement of the temperature compensation function. Since a third stage amplifier AMP3 is the output stage of the multi-stages amplifier, in addition to the temperature compensation function, the third stage amplifier AMP3 may need a linear compensation function to avoid signal distortions. Therefore, the third stage amplifier AMP3 is electrically connected with the fourth embodiment of the bias circuit 400 to achieve the requirements of the temperature and linearization compensation function. In another embodiment, the first stage amplifier AMP1, the second stage amplifier AMP2 and the third stage amplifier AMP3 may be electrically connected with any of the bias circuits of the above embodiments.

Figure 8:
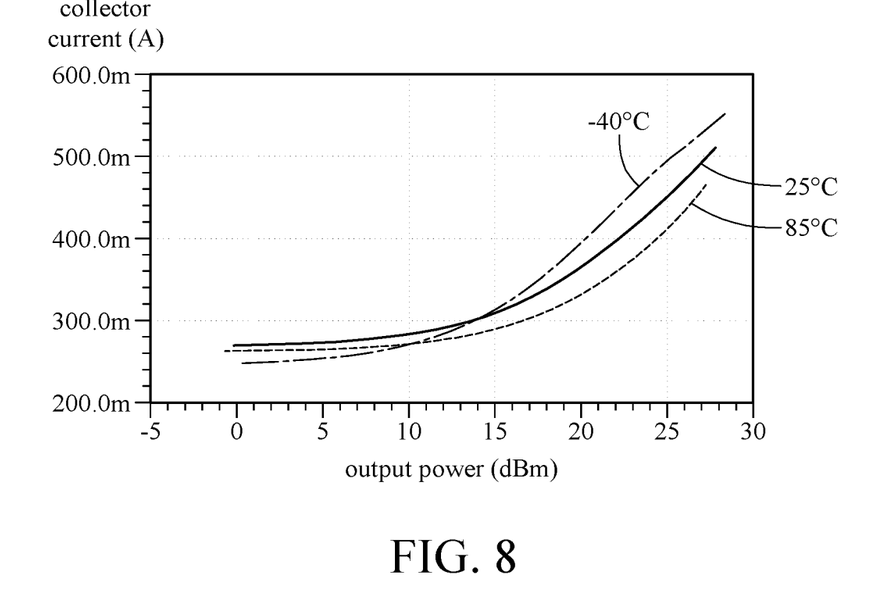
FIG. 8 is a diagram showing a relationship between a collector current and an output power according to an embodiment of the disclosure.
Figure 9:
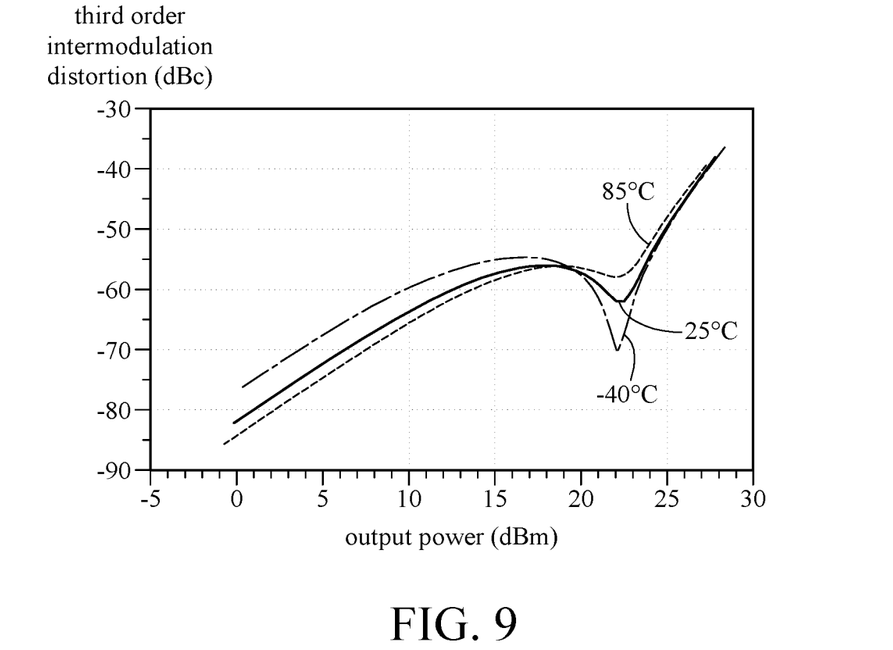
FIG. 9 is a diagram showing a relationship between a third order intermodulation distortion and an output power according an embodiment of the disclosure.

FIG. 8 is a diagram showing a relationship between a collector current and an output power according to an embodiment of the disclosure. FIG. 9 is a diagram showing a relationship between a third order intermodulation distortion and an output power according to an embodiment of the disclosure. As shown in FIG. 8, the distributions of the collector current-output power curves of the buffer 10 of the bias circuit 100 are substantially the same at three different temperatures, which indicates that the bias circuit 100 makes the collector current less affected by the temperature. As shown in FIG. 9, the distributions of the third-order intermodulation distortion-output power curves of the buffer 10 of the bias circuit 400 are substantially the same at three different temperatures, which indicates that the bias circuit 400 makes the linearity less affected by the temperature.

According to an embodiment of the disclosure, a bias circuit having a temperature compensation function is provided, which allows driving currents supplied by a buffer to an external amplifier to be stable, so that the performance of the external amplifier is less influenced by the variation of the temperature.

According to an embodiment of the disclosure, when an output current of the buffer is changed due to a temperature change, the second transistor can detect the change of the output current and a voltage at the second terminal of the second transistor changes with the output current. The voltage change at the second terminal of the second transistor varies a voltage at the first terminal of the first transistor and the output current of the buffer by the feedback circuit, thereby achieving a temperature compensation function. The temperature compensation amount can be changed by adjusting the size of the second transistor or the temperature compensation component. Therefore, the output current of the buffer is not drastically changed due to the temperature, and the stability of the driving current supplied to the external amplifier by the bias circuit is higher, so that the performance of the external amplifier is not easily attenuated due to temperature effects.

In view of the above description, when the output current of the buffer changes due to the temperature, the temperature compensation circuit first detects the change of the output current of the buffer. Then, the input voltage of the temperature compensation circuit is changed accordingly due to the change of the output current of the buffer. Then, the change of the input voltage of the temperature compensation circuit changes, through the feedback circuit, the input voltage and the input current of the buffer, thereby achieving the purpose of the temperature compensation function of the buffer. On the other hand, a user can adjust the temperature compensation amount of the buffer by adjusting the size of the transistor and/or the value of the resistor of the temperature compensation circuit. Therefore, the output current of the buffer does not change drastically due to the influence of the temperature, so the stability of the driving current supplied to the amplifier is high, which results in a situation in which the performance of the amplifier is less degraded due to the temperature influence.

What is claimed is:

1. A bias circuit comprising:
a buffer including a first transistor, with a first terminal and a second terminal of the first transistor electrically connected with a first voltage source, and a third terminal of the first transistor being configured to electrically connected with an external amplifier;
a temperature compensation circuit including a second transistor and a temperature compensation component, with a first terminal of the second transistor connected with the third terminal of the first transistor, two terminals of the temperature compensation component connected with a second terminal of the second transistor and the first voltage source respectively, and a third terminal of the second transistor being grounded; and
a feedback circuit, connected with the first terminal of the first transistor and the second terminal of the second transistor.

2. The bias circuit in claim 1, wherein the buffer further includes a first resistor, a second resistor and a capacitor, the first resistor is electrically connected between the first terminal of the first transistor and the first voltage source, the first terminal of the first transistor is electrically connected with the capacitor, the second resistor is electrically connected between the third terminal of the first transistor and the external amplifier.

3. The bias circuit in claim 1, wherein the temperature compensation component is a resistor or an inductor.

4. The bias circuit in claim 1, wherein the feedback circuit includes a third transistor and a fourth transistor, the third transistor is electrically connected with the fourth transistor, the third transistor is electrically connected with the second terminal of the second transistor, and the fourth transistor is electrically connected with the first terminal of the first transistor.

5. The bias circuit in claim 4, wherein a first terminal of the fourth transistor is electrically connected with a second terminal of the fourth transistor and the first terminal of the first transistor, and a first terminal of the third transistor is electrically connected with the second terminal of the second transistor, a second terminal of the third transistor and a third terminal of the fourth transistor.

6. The bias circuit in claim 5, further comprising a linearization circuit, the feedback circuit further includes a fifth transistor, the fifth transistor is electrically connected with the fourth transistor and the linearization circuit.

7. The bias circuit in claim 6, wherein a first terminal of the fifth transistor is electrically connected with a second terminal of the fifth transistor, the linearization circuit and a second voltage source, and a third terminal of the fifth transistor is electrically connected with the second terminal of the fourth transistor.

8. The bias circuit in claim 7, wherein the second voltage source generates the first voltage source via a voltage dividing circuit.

9. The bias circuit in claim 7, wherein the linearization circuit includes a sixth transistor, a linear compensation inductor and a linear compensation capacitor, a first terminal of the sixth transistor is electrically connected with the second terminal of the fifth transistor, a second terminal of the sixth transistor is electrically connected with the first voltage source, a third terminal of the sixth transistor is electrically connected with the linear compensation inductor and the first terminal of the first transistor, and the linear compensation inductor is electrically connected in series with the linear compensation capacitor and is configured to electrically connect with the external amplifier.

10. The bias circuit in claim 9, wherein the buffer further includes a seventh transistor and an eighth transistor, the seventh transistor is electrically connected with the eighth transistor, the eighth transistor is electrically connected with the first voltage source and the second terminal of the sixth transistor.

* * * * *